United States Patent [19]

Ridout et al.

[11] Patent Number: 4,517,585
[45] Date of Patent: May 14, 1985

[54] HEAT SINK FOR SEMI-CONDUCTOR DEVICES HAVING TERMINALS PROJECTING FROM A HEAT SINK TRANSFER FACE

[75] Inventors: Paul S. Ridout; Colin Birks, both of Birmingham, England

[73] Assignee: Lucas Chloride EV Systems Limited, Birmingham, England

[21] Appl. No.: 407,874

[22] Filed: Aug. 13, 1982

[51] Int. Cl.³ .................. H01L 23/40; H01L 23/34; H01L 23/12; H01L 23/14

[52] U.S. Cl. ........................ 357/81; 357/68; 357/65; 174/16 HS

[58] Field of Search ............ 357/81, 65, 68, 80; 174/16 HS

[56] References Cited

U.S. PATENT DOCUMENTS

| | | | |
|---|---|---|---|
| 2,791,731 | 5/1967 | Walker et al. | 357/81 X |
| 2,896,136 | 7/1959 | Hales | 357/81 |
| 3,025,437 | 3/1962 | Namen, Jr. et al. | 357/81 |
| 3,239,719 | 3/1966 | Shower | 357/81 X |
| 3,396,361 | 8/1968 | Sussman | 357/81 X |
| 3,780,795 | 12/1973 | Arnold | 357/81 X |
| 4,151,547 | 4/1979 | Rhoades et al. | 357/81 |
| 4,403,242 | 9/1983 | Tsurvoka | 357/68 |

FOREIGN PATENT DOCUMENTS 60861 4/1982 Japan .................. 357/81

OTHER PUBLICATIONS

"Heat Sink"-Bryden, *IBM Technical Disclosure Bulletin*-vol. 11, No. 10, Mar. 1969, p. 1323.

Primary Examiner—Andrew J. James
Assistant Examiner—Sheila V. Clark
Attorney, Agent, or Firm—Staas & Halsey

[57] ABSTRACT

A heat sink has an integral island portion on which there is a mounting face for heat transfer contact with the sole plate of a semi-conductor device case. Clearance bores are provided in the heat sink to receive the terminal pins of the semi-conductor device. Grooves in the face provide passages under the sole plate for wires connected to the terminal pins. Alternatively, cross passages in the island portion may be employed.

7 Claims, 4 Drawing Figures

HEAT SINK FOR SEMI-CONDUCTOR DEVICES HAVING TERMINALS PROJECTING FROM A HEAT SINK TRANSFER FACE

This invention relates to heat sinks for semi-conductor devices of the type which have terminal pins projecting from a heat transfer face of the semi-conductor device case, such as semi-conductor devices housed in the well known TO-3 and TO-66 type cases.

With semi-conductor devices of this type the heat transfer face of the case is normally mounted in face contact with a heat sink (an insulating membrane being interposed, if necessary), with the pins projecting through bores in the heat sink. The part of the heat sink on which the semi-conductor device is mounted needs to be fairly thin or a separate portion to permit electrical connections to be made to the pins. Conventionally, where the heat sink forms a part of the housing of the electronic equipment the semi-conductor devices are either mounted on the outside of the housing or on an internal integral or separate flange. The former position is unsatisfactory for equipment which is to be used in a hostile environment, such as the engine compartment of a road vehicle, and the latter position is unsatisfactory from the point of view of heat transfer efficiency.

It is accordingly an object of the invention to provide a heat sink which does not have these disadvantages.

A heat sink in accordance with one aspect of the invention has an integral mounting face against which the heat transfer face of the semi-conductor device case is to be mounted, such mounting face being formed with clearance bores to receive the pins and also with grooves extending along the mounting face to permit wires connected to the pins to lie on the same side of the heat sink as the semi-conductor device case.

Preferably the mounting face is formed on a relatively thick part of the heat sink having at least one edge, at least one of said grooves extending to the edge of said thick part.

The relatively thick part is preferably an island portion of the heat sink and may be designed to accommodate one, two or more semi-conductor devices.

In accordance with another aspect of the invention there is provided a heat sink having an integral mounting face against which the heat transfer face of the semi-conductor device case is to be mounted, such mounting face being formed with clearance bores to receive the pins, the heat sink being formed with cross passages communicating with the clearances bores respectively and with the same side of the heat sink as the semi-conductor device, whereby wires can be arranged to connect the pins of the semi-conductor device to a circuit on the same side of the heat sink as the semi-conductor device.

Preferably the mounting face is formed on a relatively thick island portion of the heat sink, said island portion having an edge into which said cross passages extend.

Figure 1:
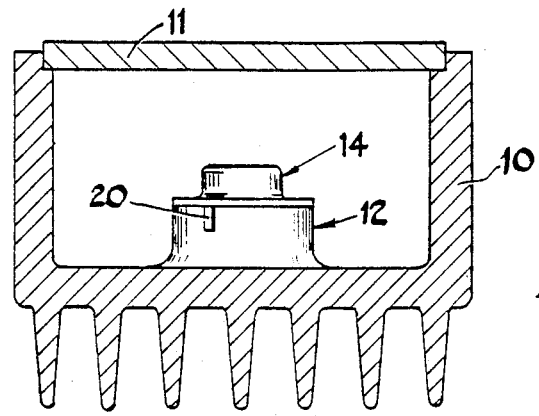
FIG. 1 is a sectional view of one example of a heat sink in accordance with the invention.
Figure 2:
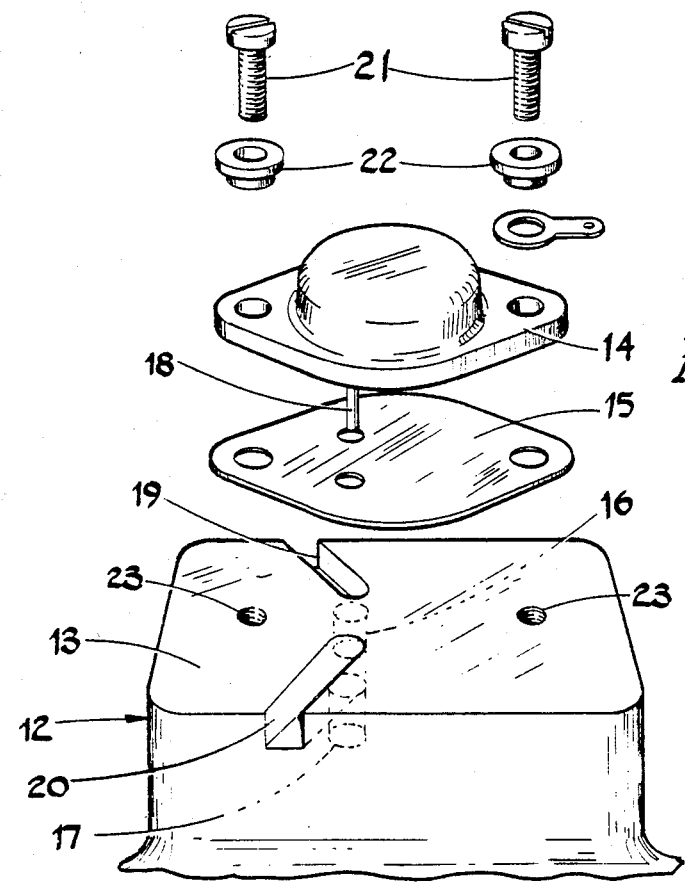
FIG. 2 is a fragmentary perspective exploded view showing the mounting of a semi-conductor device on the heat sink of FIG. 1.

Referring firstly to FIGS. 1 and 2, the heat sink 10 is in the form of an externally finned (or otherwise configured) container with a lid 11. The base of the heat sink 10 is formed on its inner side with a relatively thick island portion 12 having a flat face 13 against which the heat transfer face of the semi-conductor device case 14 can be abutted, a mica wafer 15 being interposed if the case is to be at a voltage different from that of the heat sink.

Formed in the face 13 are two bores 16, 17 positioned to receive the terminal pins 18 on the device with ample clearance. Grooves 19, 20 in the face 13 extend from these bores to the edges of the island 12. These grooves can accommodate wires connected to the pins 18.

The casing 14 is secured to the heat sink by screws 21 extending through insulating bushes in the lugs of casing, into tapped bores 23 in the heat sink.

It will be appreciated that the semi-conductor device is protectively contained within the heat sink and very effectively thermally coupled thereto.

Figure 3:
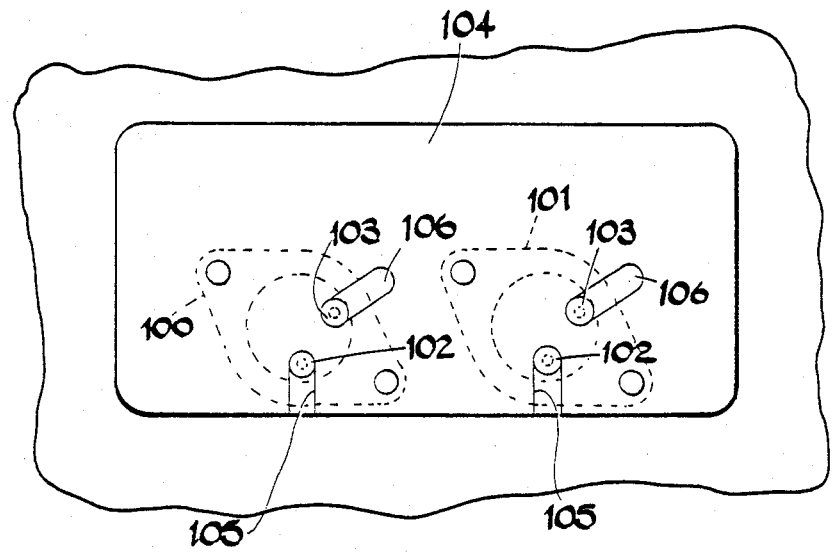
FIG. 3 is a fragmentary elevation of another example of the invention.

In the example shown in FIG. 3 the heat sink is adapted to receive two semi-conductor devices 100,101 side by side. As before the pins of each are received in blind bores 102,103, in the mounting face 104. The grooves 105 communicating with the bores 102 extend to the edge of the island. The grooves 106 communicating with the bores 103, on the other hand, merely extend a sufficient distance across the face 104 to clear the periphery of each device 100,101 and provide an entry opening for the connecting wires.

Figure 4:
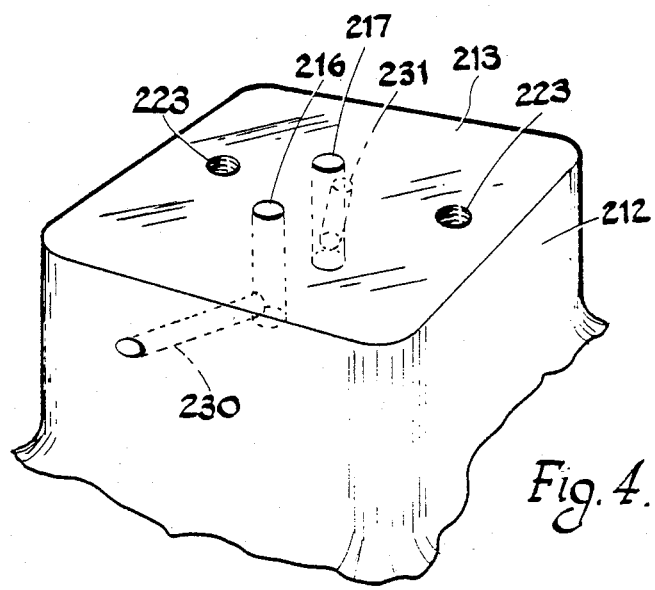
FIG. 4 is a fragmentary perspective view of yet another example of the invention.

Turning finally to FIG. 4 the heat sink has a relatively thick island portion 212 on which there is a flat face 213. The clearance bores 216 and 217 and tapped bores 223 are formed in this face, but instead of grooves in the mounting face for the connecting wires, the island portion is formed with cross passages 230,231 communicating respectively with the bores 216,217 and opening on to the edge faces of the island portion 212.

We claim:

1. A heat sink for a semi-conductor device of the type which have terminal pins projecting from a heat transfer face of the semi-conductor device case; the heat sink having a thickness greater than the length of the terminal pins and having an integral mounting face against which the heat transfer face of the semi-conductor device case is to be mounted, such mounting face being formed with clearance bores to receive the pins and also with grooves extending along the mounting face to permit wires connected to the pins to lie on the same side of the heat sink as the semi-conductor device case.

2. A heat sink as claimed in claim 1 in which the mounting face is formed on a relatively thick part of the heat sink having at least one edge, at least one of said grooves extending to the edge of said thick part.

3. A heat sink as claimed in claim 2 in which the relatively thick part is an island portion of the heat sink and may be designed to accommodate one, two or more semi-conductor devices.

4. A heat sink for a semi-conductor device of the type having terminal pins projecting from a heat transfer face of the semi-conductor device case; the heat sink having an integral mounting face against which the heat transfer face of the semi-conductor device case is to be mounted, such mounting face being formed with clearance bores to receive the pins, the heat sink being formed with cross passages communicating with the clearance bores respectively and with the same side of the heat sink as the semi-conductor device, whereby wires can be arranged to connect the pins of the semi-conductor device to a circuit on the same side of the heat sink as the semi-conductor device.

5. A heat sink as claimed in claim 4 in which the mounting face is formed on a relatively thick island portion of the heat sink, said island portion having an edge into which said cross passages extend.

6. A heat sink as claimed in claim 1, wherein said clearance bores comprise blined bores.

7. A heat sink as claimed in claim 4, wherein said clearance bores comprise blind bores.

* * * * *